US012582160B2

(12) United States Patent
Adair et al.

(10) Patent No.: US 12,582,160 B2
(45) Date of Patent: Mar. 24, 2026

(54) ELECTRONIC SMOKING DEVICE COMPRISING A RIGIDISED FLEXIBLE PCB

(71) Applicant: JT International SA, Geneva (CH)

(72) Inventors: Kyle Adair, Lisburn (GB); Peter Loveday, Epsom (GB); Olayiwola Olamiposi Popoola, Walton-on-Thames (GB)

(73) Assignee: JT International SA (CH)

( * ) Notice: Subject to any disclaimer, the term of this patent is extended or adjusted under 35 U.S.C. 154(b) by 94 days.

(21) Appl. No.: 18/023,201

(22) PCT Filed: Sep. 3, 2021

(86) PCT No.: PCT/EP2021/074391
§ 371 (c)(1),
(2) Date: Feb. 24, 2023

(87) PCT Pub. No.: WO2022/053407
PCT Pub. Date: Mar. 17, 2022

(65) Prior Publication Data
US 2023/0301347 A1 Sep. 28, 2023

(30) Foreign Application Priority Data
Sep. 9, 2020 (EP) ..................................... 20195333

(51) Int. Cl.
*H05K 1/00* (2006.01)
*A24F 40/40* (2020.01)
(Continued)

(52) U.S. Cl.
CPC ........... *A24F 40/40* (2020.01); *H05K 1/0281* (2013.01); *H05K 1/189* (2013.01); *H05K 2201/2009* (2013.01)

(58) Field of Classification Search
CPC ...... A24F 40/40; H05K 1/0281; H05K 1/189; H05K 2201/2009
See application file for complete search history.

(56) References Cited

U.S. PATENT DOCUMENTS 5,220,488 A 6/1993 Denes
5,268,064 A * 12/1993 Woo ........................ H05K 3/384
216/105
(Continued)

FOREIGN PATENT DOCUMENTS

WO WO-2019131990 A1 * 7/2019 ............... B62D 5/04
WO 2019206943 A1 10/2019

OTHER PUBLICATIONS

International Search Report for Application No. PCT/EP2021/074391 mailed Nov. 19, 2021, pp. 1-4.

*Primary Examiner* — Pete T Lee
(74) *Attorney, Agent, or Firm* — Lerner David LLP

(57) ABSTRACT

A printed circuit board is configured to mechanically support a plurality of electrical and/or electronic components which are electrically connected via conductive tracks. At least some of the conductive tracks are arranged on a common flexible carrier. A first rigidizing layer including a first rigidizing material is located at a first portion of a surface of the common flexible carrier to form a first rigidized zone. A second rigidizing layer including a second rigidizing material is located at a second portion of the surface of the common flexible carrier to form a second rigidized zone. The first portion of the surface and the second portion of the surface are spaced apart from each other. The first rigidizing material and the second rigidizing material support electrical and/or electronic components. The electrical, electronical components and/or conductor tracks are attached between the rigidizing layers.

18 Claims, 5 Drawing Sheets

Figure 1:
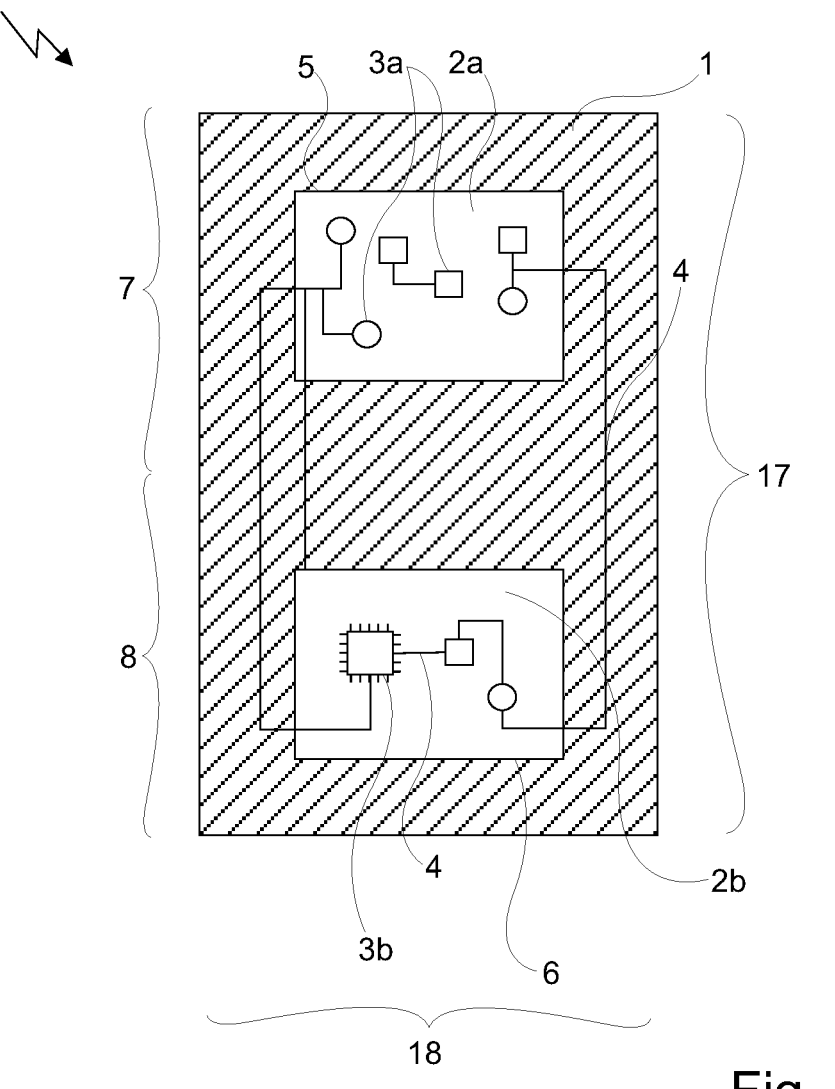

(51)  Int. Cl.
    H05K 1/02          (2006.01)
    H05K 1/189       (2026.01)

(56)             References Cited

U.S. PATENT DOCUMENTS

| | | | |
|---|---|---|---|
| 9,560,746 B1 * | 1/2017 | Bergman | ............... H05K 1/189 |
| 2011/0198111 A1 | 8/2011 | Naganuma et al. | |
| 2012/0170231 A1 | 7/2012 | Lee | |
| 2018/0020731 A1 * | 1/2018 | Rasmussen | ............. H05B 3/42 |
| | | | 131/329 |

* cited by examiner

ELECTRONIC SMOKING DEVICE COMPRISING A RIGIDISED FLEXIBLE PCB

CROSS-REFERENCE TO RELATED APPLICATIONS

The present application is a national phase entry under 35 U.S.C. § 371 of International Application No. PCT/EP2021/074391, filed Sep. 3, 2021, published in English, which claims priority to European Application No. 20 195 333.8 filed Sep. 9, 2020, the disclosures of which are incorporated herein by reference.

There are different types of flexible printed circuit boards known, wherein the relevant types of them are described in documents U.S. Pat. No. 9,560,746 B1, U.S. Pat. No. 5,220,488 A, US 2011/198111 A1, US 2012/17023 A1 and WO 2019/206943 A1. For example, flexible connections are used for devices which are in use for a long time and should offer a certain strength. Such connections contain conductor tracks that link the fixed circuit boards. This solution enables the use for example in cameras, where the several rigid circuit boards have to be connected in different installation positions and rotation orientations. In other embodiments, polyimide films are often used on or between ordinary epoxy-layers for the production of such flexible boards, which result, after deep milling, in areas with different thickness and flexibility.

The present invention relates to a rigidized flexible PCB (Printed Circuit Board), an electronic smoking device comprising a rigidized flexible PCB and a method for manufacturing such rigidized flexible PCB.

Nowadays, electronic devices are getting smaller, handier and thinner, what means that the electronics installed inside have less space in the housing. For this reason, flexible printed circuit boards are often used, which carry the electrical and/or electronic components. Typically PCBs are made up of 1 or more electrically conductive copper layers, which can be 1 oz (approx. 35 µm), 0.75 oz (26.3 µm) or 0.5 oz (approx. 17.5 µm) copper thick. To be able to stack these conductive copper layers over each other, they are sandwiched between layers known as substrates. These substrates provide 3 primary functions, wherein the first function is the electrical insulation between copper layers. As the second function, the thermal conductivity between copper layers and as the third function the rigidity of all layers together are provided.

Another example are semi-flexible circuit boards. Semi-flexible circuit boards differ from flexible circuit boards in the materials, which are used for manufacturing, and in bending limitations.

Additionally, instead of the polyimide material, a standard thin laminate epoxy-material is used to offer a cost-effective alternative for certain applications.

The two mentioned examples are quite flexible and can be used in relatively small devices. However, the flexibility is not sufficient for electronic smoking devices. These are often anatomically shaped in such a way that a housing is particularly comfortable in the user's hand. For example, the housing may resemble a classic cigarette that has a cylindrical shape. The shape of the classic cigarette is too thin in this case to be able to place one of the two flexible printed circuit boards, which were disclosed above, inside the housing.

It is therefore the objective of the invention to provide a printed circuit board which fits into a small housing of an electronic smoking device. The printed circuit board should be very flexible, whereby its function must not be affected.

The afore mentioned problems are solved by a printed circuit board mechanically supporting a plurality of electrical and/or electronic components which are electrically connected via conductive tracks. In particular, the printed circuit board is configured to mechanically support of the plurality of electrical and/or electronic components. At least some of the conductive tracks are arranged on a common flexible carrier, wherein a first rigidizing layer comprising a first rigidizing material is located at a first portion of a surface of the common flexible carrier to form a first rigidized zone, characterized in that a second rigidizing layer comprising a second rigidizing material is located at a second portion of a surface of the common flexible carrier to form a second rigidized zone, wherein the first portion of the surface and the second portion of the surface are spaced apart from each other, wherein the first rigidizing material, preferably the first rigidized zone, and the second rigidizing material, preferably the second rigidized zone, support electrical and/or electronic components. According to the invention, the electrical and/or electronical components and/or conductor tracks are attached between the rigidizing layers.

The structure of the flexible PCB can be described as follows. A common flexible carrier comprising a core layer forms a base of the PCB. Preferably the thickness of the base is in the range of 30-70 µm, more preferred 40-60 µm. A first conductive layer is preferably applied continuously over a complete upper side of the base. Preferably, the first conductive layer comprises copper. The thickness of the first conductive layer is preferably in range of 10-30 µm, more preferred 18 µm. A second conductive layer is preferably applied continuously over a complete lower side of the base. Preferably the thickness of the second conductive layer is similar to the first conductive layer. On the complete first and second conductive layer, preferably an adhesive layer is continuously applied. Preferably the thickness of the adhesive layer is in range of 15-40 µm, more preferred 25 µm. Preferably, on each of the conductive layers or on the adhesive layers a cover layer is continuously applied. The thickness of the cover layer is preferably in range of 10-15 µm, more preferred 12 µm. The layered structure described above preferably forms the common flexible carrier of the flexible PCB. Preferably, the thickness of the common flexible carrier is in range of 100-200 µm, more preferred 160-195 µm. It is possible that separate layers or the entire flexible carrier vary in thickness. It is also conceivable that further layers are added to the common flexible carrier.

In this context, rigidizing zones mean that there are zones with increased strength. Such zones are less flexible than the whole flexible carrier comprising the base. The flexible carrier preferably comprises conductive copper layers. Preferably, the copper layers are separated by thin substrate layers from each other. Preferably, the base in the middle of the flexible carrier comprises polyimide or nylon. Preferably, the Young's modulus of the common flexible carrier is up to 2.5 GPa. It is also conceivable to use other substrates with similar physical and chemical properties. Preferably the Young's modulus of the substrate is 10 GPa. It is preferred that the base can be bent 180° without breaking. The increased strength in certain zones is important for attaching the electrical and/or electronic components that need high support. According to standards for bending in components like CECC 0082 (equivalent to EIA PN-3333) and IEC 60068-2-21, 2-terminal SMT chip resistors and capacitors preferably should not crack when bent/deflected/strained to between 2-3 mm from flat. SMT components with 3 pins or more have increasing structural integrity and much larger external forces will be required to bend them preferably up to 2-3 mm. As long as the PCB laminate is not acted upon by a sustained, large, focused and unidirectional force none of the individual components preferably bends above 2 mm from flat. With these bending restrictions, the flexible carrier preferably remains flexible and bendable without breaking up to 180° between the rigidizing zones.

The following additional layers are applied on the upper and lower side of the flexible carrier to form at least two, preferably separate, rigidizing zones. The size of the rigidizing zones varies and depends on the used electrical and/or electronical components. Preferably, on the cover layers of the flexible carrier at least two glass fiber layers are applied. Preferably the thickness of one glass fiber layer is in range of 30-70 μm, more preferred 40-60 μm, most preferred 50 μm. A third conductive layer comprising copper is applied on the glass fiber layer of the upper side of the flexible carrier. Preferably the thickness of the third conductive layer is in range of 10-30 μm, more preferred 18 μm, most preferred similar to the thickness of the first and/or second conductive layer. A fourth conductive layer comprising copper is applied on the glass fiber layer of the lower side of the flexible carrier. Preferably, the thickness of the fourth conductive layer is in range of 10-30 μm, more preferred 18 μm, most preferred similar to the thickness of the first, second and/or third conductive layer. A plated copper is then applied on the third and fourth conductive layer. Preferably the thickness of the plated copper is in range of 15-40 μm, more preferred 25 μm. On the third and fourth conductive layer a soldermask layer is applied acting as a cover of the respective rigidizing zone. Preferably, the thickness of the soldermask layer is 10 μm. It is conceivable that the rigidizing zones are formed only on one side of the flexible carrier. The total thickness of the rigidizing zone comprising one conductive layer on one of the sides of the flexible carrier is preferably in range of 120-180 μm, more preferred 141-221 μm. It is possible that there are more than one conductive layers comprising copper in the rigidizing zone on each side. Preferably between the conductive layers the glass fiber layers are applied.

The common flexible carrier ensures a special flexibility of a printed circuit board. Depending on the area of application, the rigidizing zones can be particularly small, so that the shape adaptation of a printed circuit board in the housing of the electronic smoking device is no longer a problem. Preferably, more than two rigidizing zones are formed on the flexible printed circuit board. More preferably, the number of the rigidizing zones is adapted to the necessary number of electrical and/or electronical components.

It is conceivable, that if there is enough space in the housing of the device, the rigidizing zones are formed also larger in order to be able to place more electrical and/or electronical components on each of the rigidizing zones. Preferably, for a very small space in the housing of the device, the rigidizing zones are formed as small zones, which are supporting only one electrical and/or electronical component. In this case the printed circuit board is particularly flexible and can adapt particularly to the rounded housing of e.g. an electronic cigarette. It is particularly advantageous in this context because the rigidizing zones comprising conductive tracks (also referred to as interconnects) are placed on a common carrier on which the conductive tracks are also arranged outside of the rigidizing zones. For this reason, the electrical and/or electronical components from different rigidizing zones can be connected if necessary.

The electrical and/or electronic components are preferably soldered onto the rigidizing zones of a flexible printed circuit board. This is possible if the soldering points or soldermasks are prepared on the rigidizing zones. More preferably, the electrical and/or electronic components are pressed into the rigidizing zones of a flexible printed circuit board. It is also conceivable that the electrical and/or electronic components are glued to the rigidizing zones of the flexible printed circuit board with a conductive and heat-resistant adhesive. Such an adhesive comprises one or several components, which dry in a certain order when assembled or after other influences such as heat, cold or UV-rays.

The rigidizing zones provide a placement area for the electronical and/or electric components. In addition, the rigidizing zones preferably act as an endoskeleton to protect the mounted components from stresses, strains, flexing and bending. It is also possible that the rigidizing zones provide just enough rigidity with the device enclosure acting as an exoskeleton for the components. If external forces acting on the device are not transferred to the flexible PCB inside, then the components are just as protected as the former configuration.

According to another embodiment, the first rigidizing layer and the second rigidizing layer comprise the same rigidizing material.

This kind of the limitation of used materials to form the rigidizing zones has several advantages. At first, the rigidizing layers preferably can be applied on the common flexible carrier in only one manufacturing process step. As a result, the manufacturing time of such a flexible circuit board can be significantly reduced. In addition, the manufacturing method preferably can be simplified a lot, what can reduce the manufacturing costs.

It is conceivable that the first and the second rigidizing layer comprising the same rigidizing material are placed on an upper and lower side of the common flexible carrier. In this case the electrical and/or electronical components can be mounted on the both sides of the common flexible carrier. The rigidizing property is particularly noticeable at the points where the common flexible carrier is occupied on both sides.

It is also possible that the number of the conductive layers varies between the upper side and the lower side of the common flexible carrier. In this case the rigidizing zones comprise preferably the same rigidizing material but different rigidity because of the number of the applied layer and the resulting thickness variation.

According to another embodiment, the first rigidizing layer and/or the second rigidizing layer is a single layer of a rigidizing material or part of a rigidizing laminate comprising ≥2, preferably ≥3, more preferably ≥4, most preferably ≥5 layers, from which ≥1, preferably ≥2, more preferably ≥3, most preferably ≥4 layers comprise the same rigidizing material. Preferably the first rigidizing layer and/or the second rigidizing layer is a single layer which comprises a rigidizing material. It is also conceivable that the first rigidizing layer and/or the second rigidizing layer is a part of the rigidizing laminate. Preferably the rigidizing laminate comprises ≥2, preferably ≥3, more preferably ≥4, most preferably ≥5 layers, from which ≥1, preferably ≥2, more preferably ≥3, most preferably ≥4 layers. Preferably, but not necessarily, the layers of the rigidizing laminate comprise the same rigidizing material.

Preferably, for use as rigidizing laminate or material polyimide, dissolved in the solvents dimethylformamide, dimethylacetamide or N-Methyl-2-pyrrolidone is suitable because of their heat resistance, low outgassing, radiation resistance and insulating properties in the form of light brown, semi-transparent films. It is also conceivable to use other materials. The solvent can be removed during or after the hardening process by a further chemical process. Preferably, the solvent evaporates.

It is conceivable that the flexible printed circuit boards comprise three or more layers of conductive tracks inside the rigidizing and flexible layers. All rigidizing and flexible layers are then interconnected by means of plated through holes, wherein it is possible to provide openings to access lower circuit level features. Preferably, the layers are continuously laminated together throughout the construction with the exception of the areas occupied by plated through-holes. However, it is also conceivable to leave the layers completely or only partially unlaminated. The discontinuous lamination is preferably common in cases where maximum flexibility is required. This is accomplished by leaving the areas unbonded where flexing or bending is to occur.

It is conceivable that electrical and/or electronic components and/or conductor tracks are attached between the rigidizing layers. For example, it is necessary to ensure a low-induction power supply for all components. Preferably, inductors, coils, small capacitors, contacts or heat sinks are formed directly as a copper layer structure. Preferably resistors are printed on the surface or in the hidden layers, preferably using special pastes. This can save components and their assembly, what is very important for use of the flexible printed circuit boards inside the small housings.

According to another embodiment, the laminate comprising the first rigidizing layer and/or the second rigidizing layer further comprises a layer or laminate comprising the same material as the common flexible carrier. Additionally or alternatively, the laminate comprising the common flexible carrier, the first rigidizing layer and/or the second rigidizing layer further comprises at least no-flow Pre-preg 106 Glass.

There are a number of different materials which can be used as the common flexible carrier of the rigidizing zones. Preferably, this material comprises polyester, more preferably, polyethylene naphthalate or polyetherimide. It is also conceiving to use materials comprising various fluropolymers or copolymers. Most preferred are materials comprising polyimides, because of their blend of advantageous electrical, mechanical, chemical and thermal properties. A mixture of the aforementioned materials or any other suitable material is also conceivable for use in the common flexible carrier of the rigidizing zones.

It is advantageous if one or both of the rigidizing layers contain the same material as the common carrier and the same percentage of this material. For this reason, the rigidizing zones can also be made more flexible to a certain extent. Preferably, there are more than two rigidizing layers containing the same material as the common carrier.

It is conceivable that the rigidizing zones contain different percentage of flexible materials like in the common flexible carrier. It is advantageous when different rigidizing zones have to be flexible in different ways. For example, in the case of rather small electrical and/or electronic components, it is preferred to make the rigidizing zone more flexible, while in the case of large electrical and/electronic components, a more rigid rigidizing zone would be preferred.

According to another embodiment, the common flexible carrier is a laminate of ≥2, preferably ≥3, more preferably ≥5, most preferably ≥7 layers.

Due to the layered construction of the common flexible carrier, preferably different conductive tracks can be formed.

The conductive tracks can thus not only be attached to the surface of the flexible carrier, but also preferably within/between the layers.

The layers of the common flexible carrier are preferably laminated in such a way that they are pressed together under pressure. It is also possible that the layers of the common flexible carrier are laminated by an influence of heat. More preferred, the layers of the common flexible carrier are laminated by pressure and influence of heat. It is also possible that the layers of the common flexible carrier are manufactured by spin-coating and curing. In such a process, the individual layers are applied to one another and evenly distributed through the rotation.

According to another embodiment, a conductive track arranged on the common flexible carrier electrically connects an electrical and/or electronic component of the first rigidized zone with an electrical and/or electronic component of the second rigidized zone.

There are preferably more than two rigidized zones on which electrical and/or electronic components are connected to one another via the conductive tracks. Also preferably, there are more than one electrical and/or electronic component on each of the rigidizing zones.

It is also conceivable that the conductive tracks arranged inside/between the layers of the common flexible carrier are connected to conductive tracks arranged inside/between the layers of the rigidizing zones and/or to the electrical and/or electronic components inside/on top the layers of the rigidizing zones. Preferably, the conductive tracks are inside/between the layers and on the surface of the printed circuit board.

Additionally or alternatively, the rigidized zones comprise conductive tracks. Preferably the conductive tracks are arranged between the rigidizing layers of the rigidized zones. Also preferably, the same conductive tracks are arranged between the layers of the common flexible carrier.

According to another embodiment, the rigidizing layers, the conductive tracks and at least the flexible carrier are arranged parallel to each other. Preferably, the rigidizing layers, the conductive tracks and at least the flexible carrier each extend along a plan which is parallel to an outer surface of the printed circuit board. Also preferably, the plans with rigidizing layers, with conductive tracks and/or with flexible carrier are parallel to each other.

According to another embodiment, beside the conductive tracks, no further electrical and/or electronic components are arranged on the common flexible carrier.

A special feature of this embodiment is that the common flexible carrier preferably can be made particularly thin and thus pliable. The electrical and/or electronic components outside the rigidizing zones would also not have sufficiently stable base on the flexible common carrier. It is therefore important to place the electrical and/or electronic components only in the rigidizing zones.

According to another embodiment, the common flexible carrier extends along the entire length of the printed circuit board and/or the entire width of the printed circuit board.

If the common flexible carrier extends over the entire width and length of the printed circuit board, this means that preferably the entire printed circuit board is flexible and/or bendable. However, if necessary, the common flexible carrier can also be flexible in part in terms of width or length. It is therefore conceivable that the circuit board is completely flexible in length, while only half flexible in width, for example. Such an embodiment would be necessary if a lot of hold for some of the electrical and/or electronic components would be necessary.

According to another embodiment, a laminate comprising the common flexible carrier the first rigidizing layer and/or the second rigidizing layer is free from glass-reinforced epoxy laminate material, preferably free from reinforcing fibers and/or free from epoxy resins.

In the current state of the art, epoxy resin is not recyclable and the materials used to manufacture it are predominantly obtained from petroleum and potentially harmful to health. It is therefore important to avoid the epoxy resins or substances containing them in the manufacture and use in the electrical/electronic devices.

In addition, the epoxy resin is a hard material that is usually used as a base for the printed circuit boards. A flexible printed circuit board contains also rigidizing zones, but these are preferably not necessarily as rigid as the conventional printed circuit boards. The rigidizing zones are only rigid enough to place the electrical and/or electronic components on them. Preferably the rigidizing zones are also flexible, but only ≥50% of the flexibility of the common flexible carrier.

According to another embodiment, the rigidizing zones are flexible to at least 50% extent of the common flexible carrier flexibility. Thus, the flexibility of the rigidizing zones and the flexibility of the common flexible carrier comprise a different extent. Preferably the Young's modulus, also preferably flexural or bending modulus, of the common flexible carrier is lower than the Young's modulus of the rigidizing zones.

According to another embodiment, the rigidized zones are arbitrarily arrangeable on the surface of the common flexible carrier. Preferably the rigidized zones are systematically distributed on the surface of the common flexible carrier. Also preferably, the distributed rigidized zones form a pattern on the common flexible carrier. It is conceivable that the rigidized zones differ in color from the common flexile carrier. This way, the flexible and rigidized zones of the flexible printed circuit board are distinguishable from each other.

According to another embodiment, the common flexible carrier electrically interconnects 3, preferably ≥4, more preferably ≥5, most preferably ≥6 rigidized zones.

In a case of a particularly complex construction of a small electrical device, for example a smart smoking device, a large number of electrical and/or electronic components is required. In such a case, a long, flexible printed circuit board with many rigidizing zones is needed, which, for example, can preferably be rolled up or folded in a housing, if the space inside is limited.

The objective is also reached by an electronic smoking device comprising a void and a lateral outside area, characterized by a printed circuit board according to any preceding embodiment.

A smoking device has a surrounding surface, also referred to as lateral outside area, which encloses the void in the device. Preferably, the printed circuit board is arranged in the void. The volume of the void of the electronic smoking device is preferably as large as possible so that at least one flexible printed circuit board fits into the void and is arrangeable in it. More preferably, several flexible printed circuit boards fit into the void of the electrical smoking device. It is also conceiving that the flexible printed circuit boards are rolled into each other to save space in the void. Several flexible circuit boards are therefore advantageous because if the electronic smoking device is damaged or defective, the flexible circuit boards are easily interchangeable.

In case of an anatomically shaped electronic smoking device, for example shaped as a classic cigarette, it is also conceivable to attach the flexible printed circuit board outside the void or on the lateral outside area. This is especially necessary if the device has a touchscreen and therefore a display, which preferably must be controllable and connected to the electrical and/or electronic components arranged in the void of the device, wherein a through-hole is present on the lateral outside area. In this way, components such as sensors can be connected to the display from the inside.

According to another embodiment, the printed circuit board is insertable in the void of the electronic smoking device.

The flexible shape of the printed circuit board offers to hide all the electronics in the housing of an electronic smoking device. The flexible printed circuit board can preferably be rolled up and then inserted in the void. If the housing is flat and the void accordingly too, it is conceivable to fold the flexible printed circuit board. This is particularly possible if the common flexible carrier is particularly flexible and can be bent, as well as the rigidizing zones are far apart.

According to another embodiment, the common flexible carrier of the printed circuit board is bent and an angle between a surface of the first rigidized zone and the second rigidized zone is ≥15°, preferably ≥30°, preferably ≥45°, more preferably ≥60°, most preferably ≥90°.

Because the rigidizing zones comprise the same material as the common flexible carrier, they are preferably also flexible to a certain extent. Preferably, the rigidizing zones have 50% of the flexibility of the common flexible carrier. For this reason, when the common flexible carrier bends at an angle of α≥90°, the bending of a rigidizing zone preferably can be β≥45°. The different bending angles of the rigidizing zones, depending on the bending angle of the common flexible carrier, are then preferably as follows:

| α | β |
|---|---|
| ≥15° | ≥7° |
| ≥30° | ≥15° |
| ≥45° | ≥22.5° |
| ≥60° | ≥30° |
| ≥90° | ≥45° |

It is also conceiving that the rigidizing zones have 25% of the flexibility of the common flexible carrier. The different bending angles of the rigidizing zones, depending on the bending angle of the common flexible carrier, are then preferably as follows:

| α | β |
|---|---|
| ≥15° | ≥3.8° |
| ≥30° | ≥7.5° |
| ≥45° | ≥11.3° |
| ≥60° | ≥15° |
| ≥90° | ≥22.5° |

Preferably, the dependence on angle β can be calculated as a percentage from angle α. It is also conceivable that the percentage would be other than 25% or 50%.

More preferably, the angle β is not dependent from angle α. In such a case, the angle β is a fixed bending angle to which a rigidizing zone can be bent.

The objective is also reached by a method for manufacturing a printed circuit board mechanically supporting a plurality of electrical and/or electronic components which are electrically connected via conductive tracks. In particular, the printed circuit board is configured to mechanically support of the plurality of electrical and/or electronic components. The method comprises steps of:

a) providing a flexible carrier, b) providing a first rigidizing material and a second rigidizing material, c) applying the first rigidizing material on a first portion of a surface of the common flexible carrier to form a first rigidized zone, d) applying the second rigidizing material on a second portion of a surface of the common flexible carrier to form a second rigidized zone, wherein the second portion is spaced apart from the first portion of the surface, e) applying conductive tracks to arrange on the common carrier, and f) positioning of electrical and/or electronic components in first rigidized zone and the second rigidized zone.

It is also conceivable that further steps are added during the manufacturing process and/or can change the order. Step f) can, for example, also be carried out before step e). Preferably conductive tracks and simple electrical components, such as resistors are placed between the rigidizing layers during the manufacturing process of the rigidizing zones. More preferably, the conductive tracks are also placed between the layers of the common flexible carrier during the manufacturing process. It is also conceivable to carry out step f) after step b) so that the conductive tracks can also be located between the layers. Then another intermediate step b.1) is required to provide openings to access lower circuit level features.

In an electrical smoking device, it is preferred to make the electrical and/or electronic components and the entire circuit board watertight. This is possible by providing the flexible printed circuit board with a water-repellent layer after positioning of electrical and/or electronic components in first rigidized zone and the second rigidized zone.

According to another embodiment, the method for manufacturing a printed circuit board comprises step g) positioning the printed circuit board in a void of an electronic smoking device. Preferably, this step is carried out as the last step of the method.

The printed circuit board is preferably positioned according to the space available in the void. The flexible printed circuit board can preferably be inserted rolled up or folded into the void.

It is also conceivable that the flexible circuit board is attached to the lateral outside area, outside the void. The position of the flexible printed circuit board in or on the electronic smoking device is preferably adapted to the requirements for the smoking device and the printed circuit board.

Further advantages, objectives and features of the present invention will be described, by way of example only, in the following description with reference to the appended figures. In the figures, like components in different embodiments can exhibit the same reference symbols.

THE FIGURES SHOW

FIG. 1 a top view of a flexible printed circuit board

FIG. 2 *a-b* a side view of a flexible printed circuit board

Figures 3A, 3B, 3C:
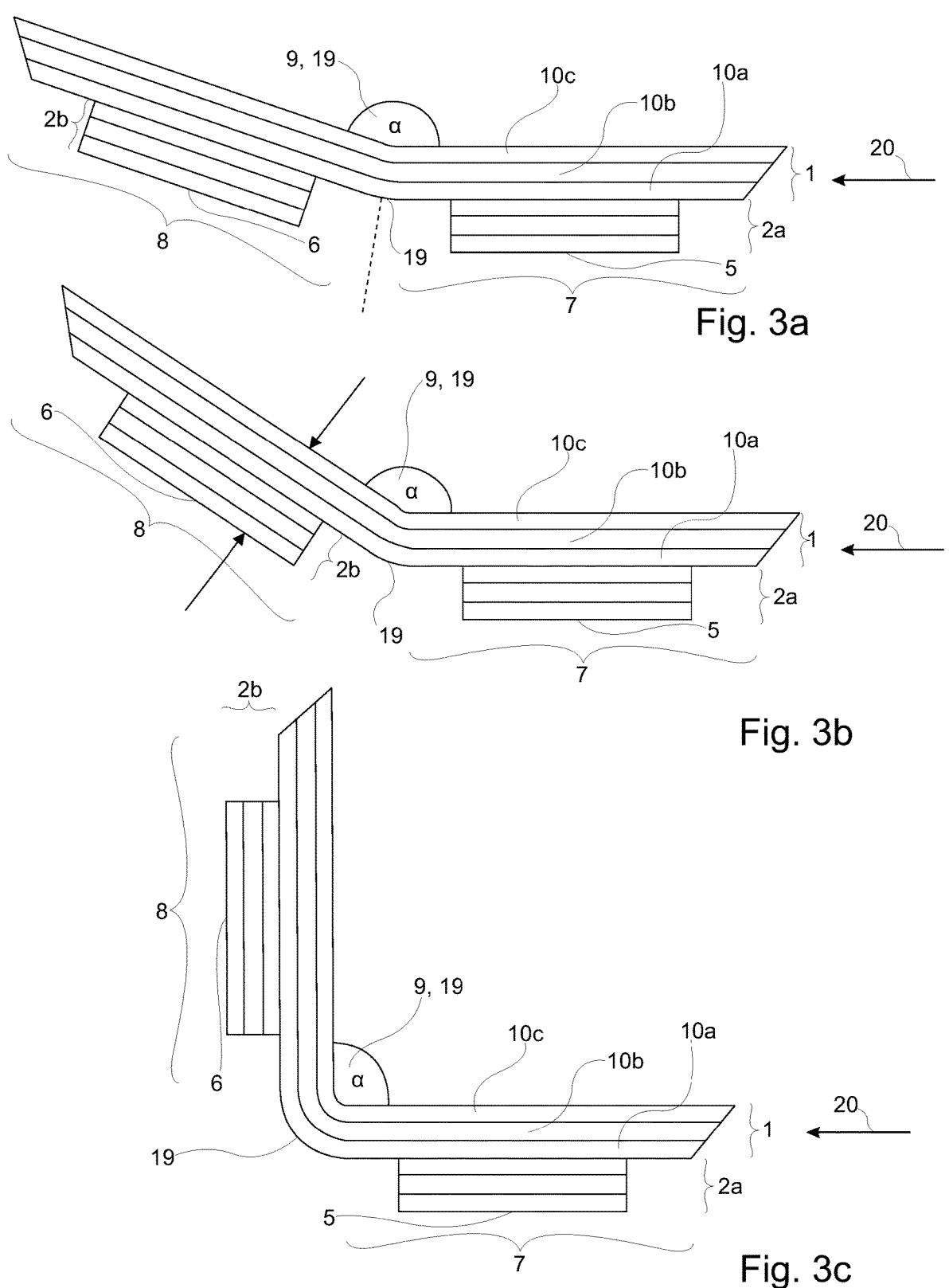
Figure 4A:
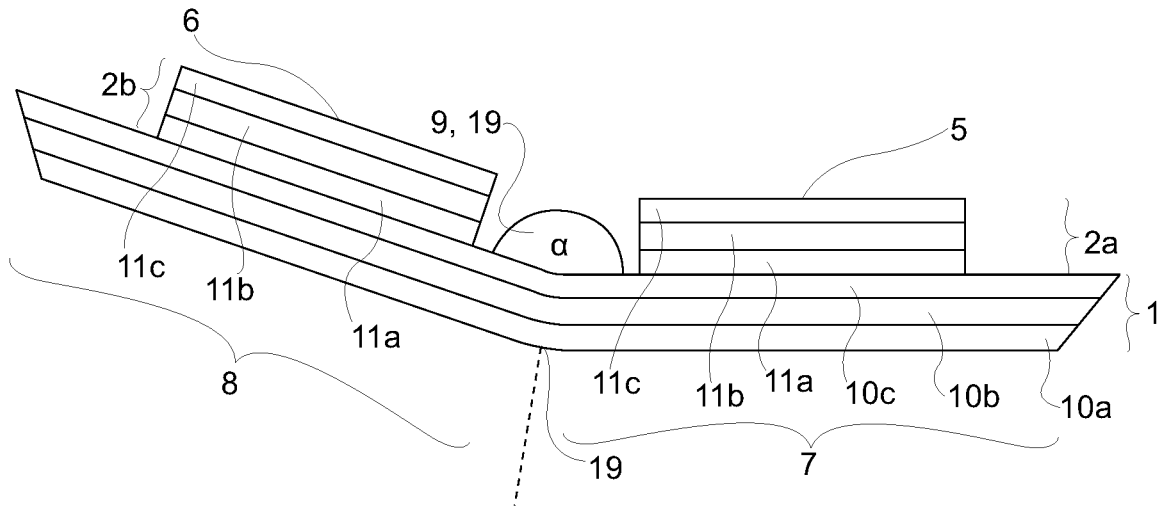
Figure 4B:
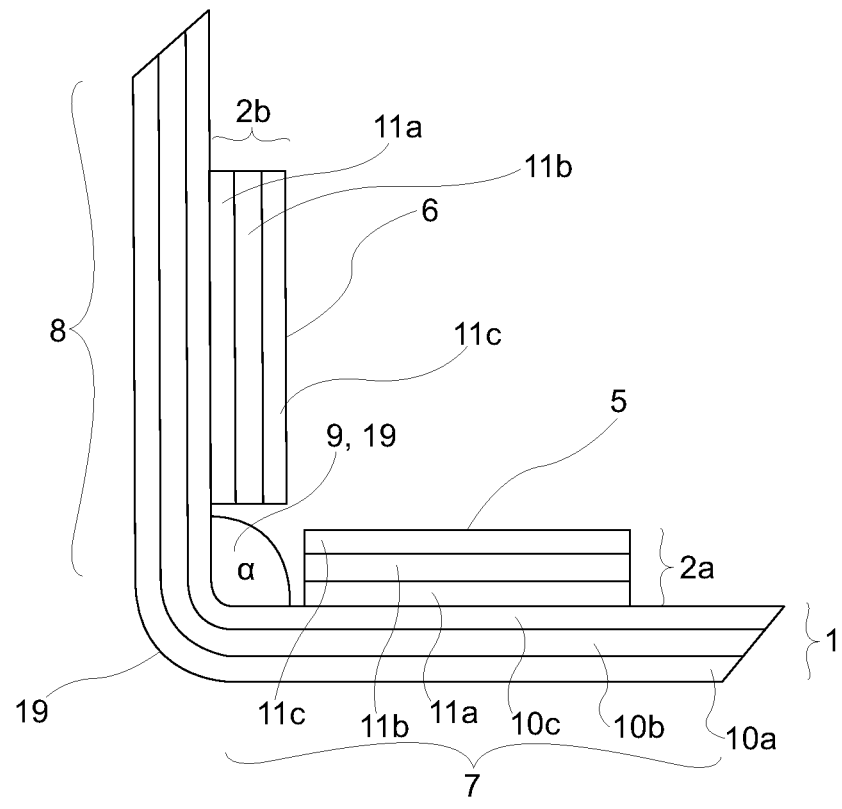
Figure 4C:
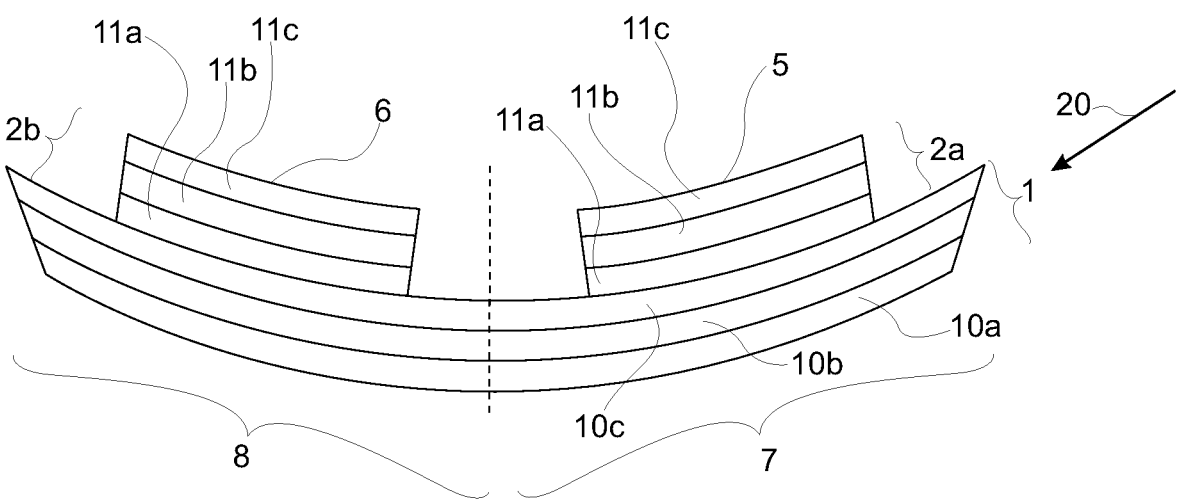
Figure 5:
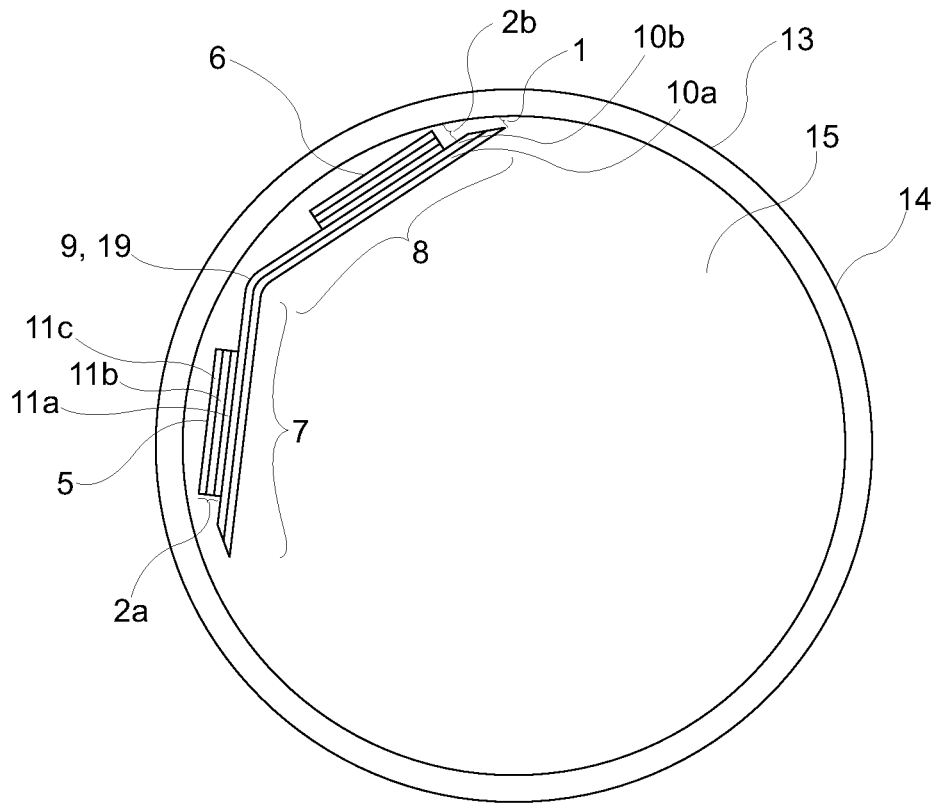

FIG. 3 *a-c* a schematic view when bending a flexible printed circuit board with rigidizing zones on the upper surface FIG. 4 *a-b* a schematic view when bending a flexible printed circuit board with rigidizing zones on the lower surface FIG. 4*c* a schematic view of a rolled flexible printed circuit board with less rigid rigidizing zones FIG. 5 a top view of a flexible printed circuit board inside an electronic smoking device In FIG. 1 is shown a top view of a flexible printed circuit board 12. The flexible carrier 1 extends over the entire width 18 and length 17 of the printed circuit board. The resulting surface comprises first 7 and second 8 portion of the surface. On the first portion of the surface 7 there is a first rigidizing layer 2*a*, which forms the first rigidizing zone 5. On the second portion of the surface 8 there is a second rigidizing layer 2*b*, which forms the second rigidizing zone 6. Preferably, the rigidizing zones 5 and 6 differ in optical appearance from the common flexible carrier 1. The difference can also be due to the surface properties of zones 5 and 6. For example, rigidizing zones 5 and 6 are preferably rather rough, while the common flexible carrier has a smooth surface.

Both rigidizing zones 5 and 6 carry electrical 3*a* and/or electronic 3*b* components. The electrical 3*a* and/or electronic 3*b* components are connected via the conductive tracks 4. The conductive tracks 4 connect not only the electrical 3*a* and/or electronic 3*b* components within one rigidizing zone 5 or 6, but also via the common flexible carrier 1, the electrical 3*a* and/or electronic 3*b* components of the first rigidizing zone 5 to electrical 3*a* and/or electronic 3*b* components of the second rigidizing zone 6.

Figure 2A:
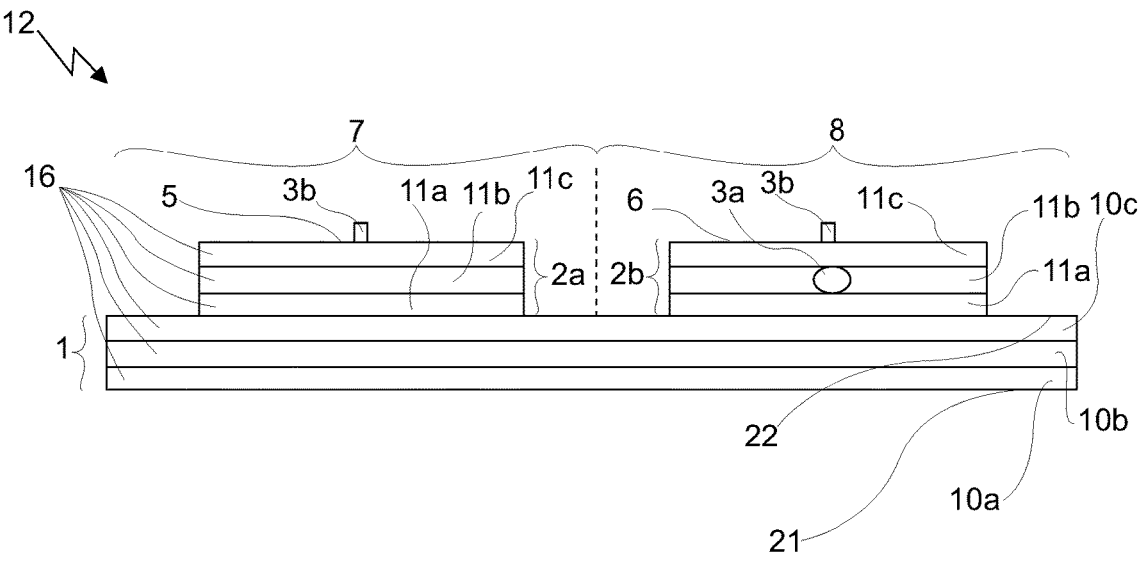

In FIG. 2*a* is shown a side view of a flexible printed circuit board 12. The common flexible carrier 1 and/or the first and second rigidizing zones 5, 6 have layered structures. The first rigidizing zone 5 comprises the first rigidizing layer 2*a*, which consists of rigidizing material layers 11*a*-11*c*. The second rigidizing zone 6 comprises the second rigidizing layer 2*b*. The first 2*a* and the second 2*b* rigidizing layer comprise preferably the same rigidizing material layers 11*a*-11*c*.

It is conceivable that all layers of the first and second rigidizing zones 5, 6 and/or of the common flexible carrier 1 are a laminate. In this case all layers of the printed circuit board 12 are preferably pressed together under the pressure. It is also possible that the layers are laminated under the influence of heat. More preferably, all the layers are laminated by pressure and the influence of heat.

The common flexible carrier 1 comprises preferably the flexible material layers 10*a*-10*c*. It is possible that for example the rigidizing material layer 10*a* consists at least in part of the same material as the flexible material layer. However, it is quite possible that the rigidizing material layer is actually a flexible material. The reference names therefore do not necessarily indicate the material properties. At this point, reference is made to the definition of "rigidizing zones" on page 2, lines 23-26.

Figure 2B:
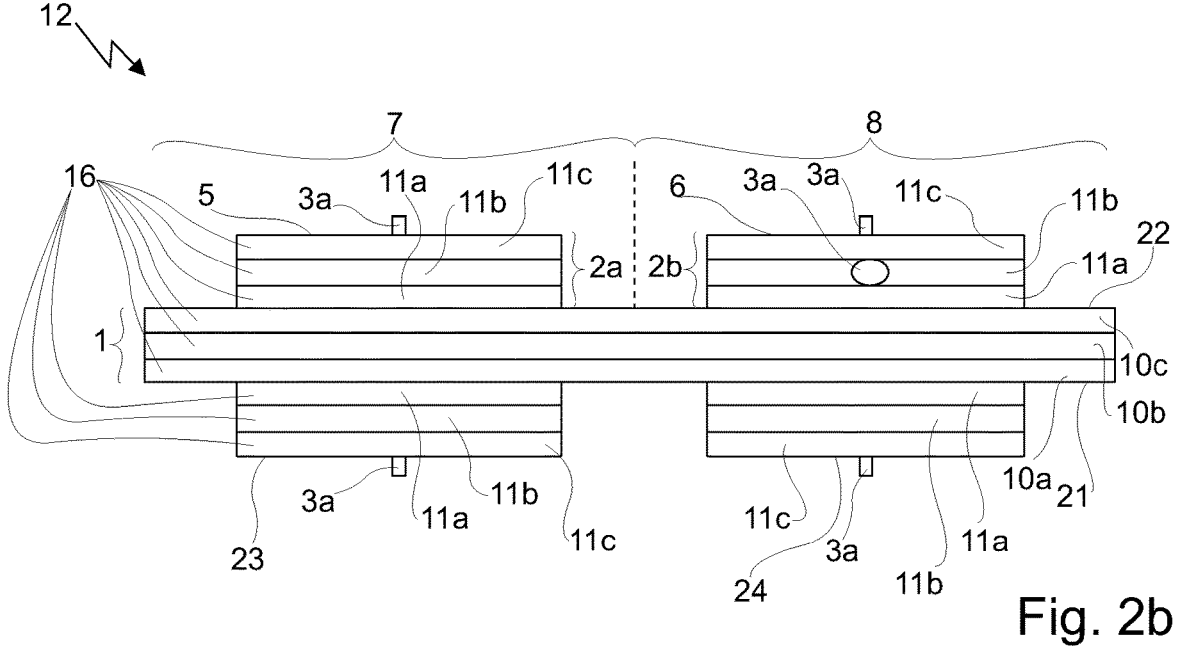

In FIG. 2*b* an alternative embodiment of a flexible printed circuit board 12 is shown. The carrier 1 has a lower and an upper surface 21, 22, on each of which rigidizing zones 5, 6, 23, 24 are located. First and second rigidizing zones 5, 6 are present on the upper surface 22. Third and fourth rigidizing zones 23, 24 are formed on the common flexible carrier 1 on the lower surface 21. The layered structure is identical to the structure described in FIG. 2*a*. The only difference is that the circuit board 12 can be used on both sides. Preferably, with regard to the first and/or second rigidizing zone 5, 6 another third and/or fourth rigidizing zone 23, 24 is arranged on the averted surface 21, compared to the surface 22 on which the first or second rigidizing zone 5, 6 is arranged, directly opposite to the first or second rigidizing zone 5, 6. In other words, the common flexible carrier 1 is preferably sandwiched between at least two rigidizing zones 5, 6, 23, 24.

In FIG. 3 *a-c* schematic views when bending a flexible printed circuit board 12 are shown. The layered structure of the first and second rigidizing zones 5, 6 and of the common flexible carrier 1 is the same as in FIG. 2. In FIG. 3*a* a view of a flexible printed circuit board 12 bent in an angle of 15° is shown. The flexible material layers 10 *a-c* are preferably stretched and/or compressed in a lateral direction 20, because of forming a corner 19 when bending the printed circuit board 12. The corner 19 is shaped round, because the strong folding of a flexible common carrier 1 could destroy the structure of the conductive tracks 4 on the top and between the layers 10*a*-10*c*. With increasing angles 9 when bending the printed circuit board 12, the layers 10*a-c* maybe stretched and/or compressed in the lateral direction 20.

In FIG. 3 *b* and in FIG. 3 *c* views of a flexible printed circuit board 12 bent in an angle of 30° and of 90° are shown. The flexible material layers 10*a*-10*c* behave similarly to the bend at a 15° angle. The corners 19 with 30° and 90° of bending are also rounded, but are more pronounced than the corner 19 with 15° of bending.

In FIG. 4 *a-b* show views of a flexible printed circuit board 12 bent in angles of 15° and 90°. The bending takes place in the opposite direction compared to the embodiment shown in FIGS. 3 *a-c*. The first and second rigidizing zones 5, 6 are directed towards one another. This means that the flexible printed circuit board 12 is bendable in two directions. The layers 10 *a-c* of common flexible layer 1 and rigidizing layers 11*a-c* behave identically to those depicted in FIG. 3 *a-c*.

FIG. 4 *c* shows a rolled-up flexible printed circuit board 12 with flexible first and second rigidizing zones 5, 6. The first and second rigidizing zones 5, 6 behave similarly to the common flexible carrier 1. The rigidizing material layers 11 *a-c* and the flexible material layers 10 *a-c* are stretched and/or compressed in a lateral direction 20.

In FIG. 5 a top view of a flexible printed circuit board 12 inside a void 15 of an electronic smoking device 13 is shown. A lateral outside area 14 of the electronic smoking device 13 is shaped round. Such shape is reminiscent of the classic cigarette shape. A void 15 of the electronic smoking device 13 comprises a round cross section. Preferably, the shape of void 15 is cylindrical. The flexible printed circuit board 12 is arranged in the void 15. The flexible circuit board 12 is bent with an angle of approx. 45°. It is also conceivable to roll up the flexible printed circuit board 12 (not shown here), if there are more of rigidizing zones like 5 and 6 and they are more flexible.

The applicant reserves his right to claim all features disclosed in the application document as being an essential feature of the invention, as long as they are new, individually or in combination, in view of the prior art. Furthermore, it is noted that in the figures features are described, which can be advantageous individually. Someone skilled in the art will directly recognize that a specific feature being disclosed in a figure can be advantageous also without the adoption of further features from this figure. Furthermore, someone skilled in the art will recognize that advantages can evolve from a combination of diverse features being disclosed in one or various figures.

12
LIST OF REFERENCE SYMBOLS 1 flexible carrier
2*a* first rigidizing layer
2*b* second rigidizing layer
3*a* electrical components
3*b* electronic components
4 conductive tracks
5 first rigidizing zone
6 second rigidizing zone
7 first portion of a surface
8 second portion of a surface
9 angle
10*a* first flexible material layer
10*b* second flexible material layer
10*c* third flexible material layer
11*a* first rigidizing material layer
11*b* second rigidizing material layer
11*c* third rigidizing material layer
12 printed circuit board
13 electronic smoking device
14 lateral outside area
15 void
16 laminate
17 entire length of the printed circuit board
18 entire width of the printed circuit board
19 corner
20 lateral direction
21 lower surface
22 upper surface
23 third rigidizing zone
24 fourth rigidizing zone

The invention claimed is:

1. A printed circuit board configured to mechanically support a plurality of electrical and/or electronic components which are electrically connected via conductive tracks, wherein at least some of the conductive tracks are arranged on a common flexible carrier, wherein a plurality of first rigidizing layers comprising a first rigidizing material is located at a first portion of a surface of the common flexible carrier to form a first rigidized zone, a plurality of second rigidizing layers comprising a second rigidizing material is located at a second portion of the surface of the common flexible carrier to form a second rigidized zone, wherein the first portion of the surface and the second portion of the surface are spaced apart from each other, wherein the first rigidized zone and the second rigidized zone support electrical and/or electronic components, wherein the electrical and/or electronic components and/or conductor tracks are attached between at least two rigidizing layers of the pluralities of first and second rigidizing layers, and wherein at least one of the conductor tracks connects a first one of the electrical and/or electronic components within one of the plurality of first rigidizing layers and the plurality of second rigidizing layers to a second one of the electrical and/or electronic components within the same plurality of the first rigidizing layers and the second rigidizing layers such that the at least one conductor and the first one and the second one of the electrical and/or electronic components are in the same plurality of rigidizing layers.

2. The printed circuit board according to claim 1, wherein the plurality of first rigidizing layers and the plurality of second rigidizing layers comprise the same rigidizing material.

3. The printed circuit board according to claim 1, wherein the plurality of first rigidizing layers and/or the plurality of second rigidizing layers are part of a rigidizing laminate comprising ≥2 layers from which ≥1 layers comprise the same rigidizing material.

4. The printed circuit board according to claim 3, wherein the laminate comprising the plurality of first rigidizing layers and/or the plurality of second rigidizing layers further comprises a layer or laminate comprising the same material as the common flexible carrier.

5. The printed circuit board according to claim 1, wherein the common flexible carrier is a laminate of ≥2 layers.

6. The printed circuit board to claim 1, further comprising a conductive track arranged on the common flexible carrier electrically connecting an electrical and/or electronic component of the first rigidized zone with an electrical and/or electronic component of the second rigidized zone.

7. The printed circuit board to claim 1, wherein beside the conductive tracks, no further electrical and/or electronic components are arranged on the common flexible carrier.

8. The printed circuit board according to claim 1, wherein the common flexible carrier extends along an entire length of the printed circuit board and/or an entire width of the printed circuit board.

9. The printed circuit board according to claim 1, wherein a laminate comprising the common flexible carrier, the plurality of first rigidizing layers and/or the plurality of second rigidizing layers comprises at least no-flow Pre-preg 106 Glass.

10. The printed circuit board according to claim 1, wherein the common flexible carrier electrically interconnects ≥3 rigidized zones.

11. The printed circuit board according to claim 1, wherein the plurality of first and second rigidizing layers, the conductive tracks and at least the flexible carrier are arranged parallel to each other.

12. The printed circuit board according to claim 1, wherein the first and second rigidized zones are flexible to at least 50% extent of a carrier flexibility.

13. The printed circuit board according to claim 1, wherein the first and second rigidized zones are arbitrarily arrangeable on the first and second portions of the surface of the common flexible carrier.

14. An electronic smoking device comprising a void and a lateral outside area, comprising:
a printed circuit board according to claim 1.

15. The electronic smoking device according to claim 14, wherein the printed circuit board is insertable in the void of the electronic smoking device.

16. The electronic smoking device according to claim 14, wherein the printed circuit board is insertable in the void of the electronic smoking device, and wherein the common flexible carrier of the printed circuit board is bent and an angle between the first portion of the surface of the first rigidized zone and the second portion of the surface of the second rigidized zone (6) is ≥15°.

17. A method for manufacturing a printed circuit board configured to mechanically support a plurality of electrical and/or electronic components which are electrically connected via conductive tracks, comprising the steps of:
providing a flexible carrier,
providing a first rigidizing material and a second rigidizing material,
applying the first rigidizing material on a first portion of a surface of the common flexible carrier in form of a plurality of first rigidizing layers to form a first rigidized zone,
applying the second rigidizing material on a second portion of the surface of the common flexible carrier in form of a plurality of second rigidizing layers to form a second rigidized zone, wherein the second portion is spaced apart from the first portion of the surface,
applying conductive tracks to arrange on the common carrier, and
positioning of electrical and/or electronic components in the first rigidized zone and the second rigidized zone, wherein at least one of the conductor tracks connects a first one of the electrical and/or electronic components within one of the plurality of first rigidizing layers and the plurality of second rigidizing layers to a second one of the electrical and/or electronic components within the same plurality of the first rigidizing layers and the second rigidizing layers such that the at least one conductor and the first one and the second one of the electrical and/or electronic components are in the same plurality of rigidizing layers.

18. The method according to claim 17, wherein the method further comprises positioning the printed circuit board in a void of an electronic smoking device.

* * * * *